(12) United States Patent
Biber et al.

(10) Patent No.: US 8,415,949 B2
(45) Date of Patent: Apr. 9, 2013

(54) METHOD AND DEVICE FOR POSITION DETERMINATION OF BODY MATRIX COILS IN MR SYSTEMS

(75) Inventors: Stephan Biber, Erlangen/Frauenaurach (DE); Klaus Ludwig, Erlangen (DE); Kay Uwe Seemann, Erlangen (DE); Johann Sukkau, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 518 days.

(21) Appl. No.: 12/777,387

(22) Filed: May 11, 2010

(65) Prior Publication Data

US 2010/0289492 A1 Nov. 18, 2010

(30) Foreign Application Priority Data

May 13, 2009 (DE) .......................... 10 2009 021 026

(51) Int. Cl.
*G01V 3/00* (2006.01)

(52) U.S. Cl. ....................................... 324/307; 324/309
(58) Field of Classification Search .......... 324/300–322; 600/407–445
See application file for complete search history.

(56) References Cited

U.S. PATENT DOCUMENTS

| 6,223,065 | B1 | 4/2001 | Misic et al. |
| 7,508,214 | B2 * | 3/2009 | Misic ............................ 324/322 |
| 7,969,383 | B2 * | 6/2011 | Eberl et al. ....................... 345/7 |
| 8,042,947 | B1 * | 10/2011 | Eberl et al. ..................... 351/246 |
| 2008/0290870 | A1 | 11/2008 | Misic |

* cited by examiner

*Primary Examiner* — Brij Shrivastav
(74) *Attorney, Agent, or Firm* — Schiff Hardin LLP

(57) ABSTRACT

In a device and a method to determine the position of at least one local coil for a magnetic resonance tomography apparatus, the field strength of a magnetic field is measured at multiple locations with at least one magnetic field strength sensor, and the position of the local coil (6) is determined based on the field strength measured at multiple locations.

26 Claims, 2 Drawing Sheets

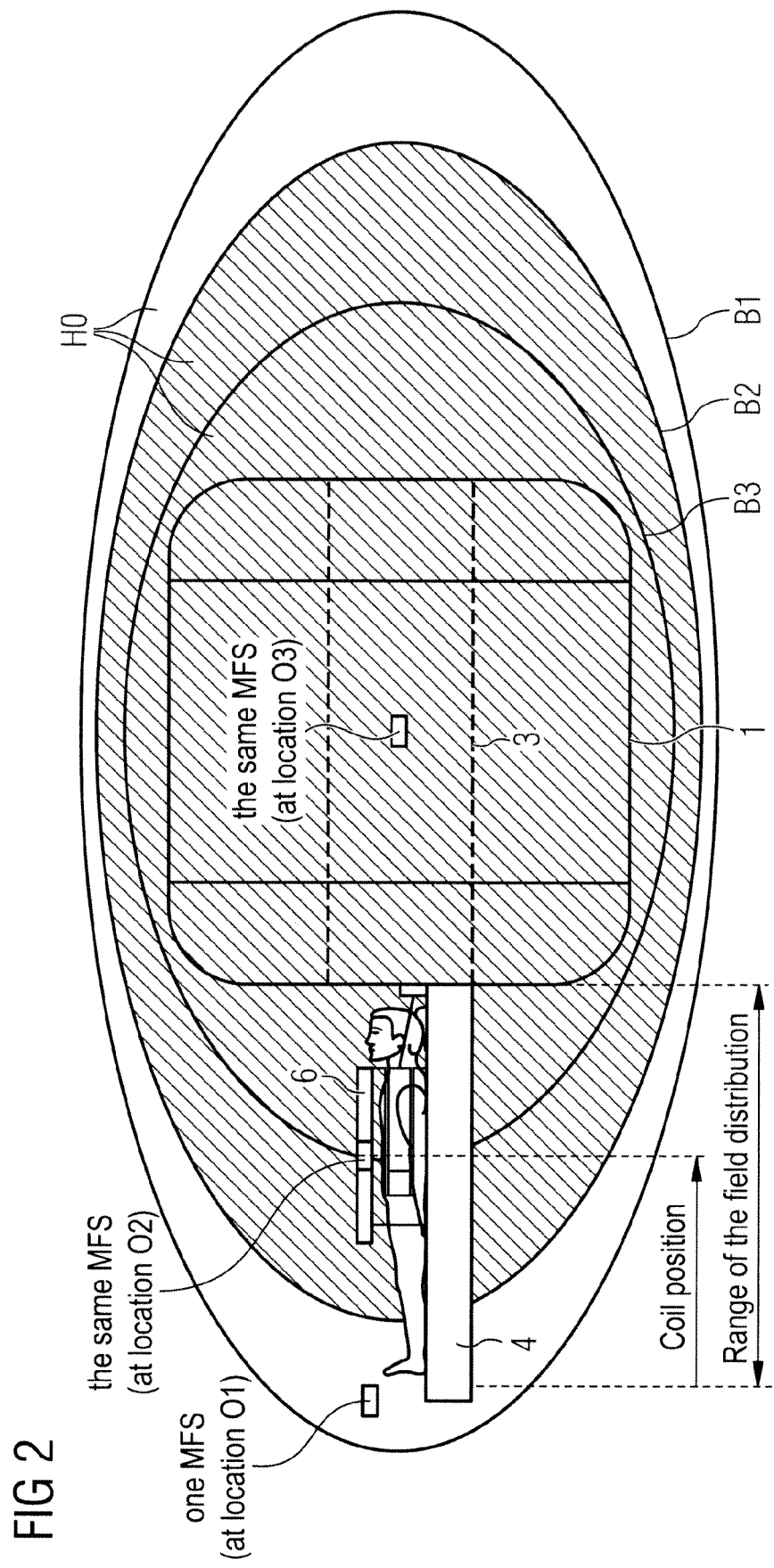

METHOD AND DEVICE FOR POSITION DETERMINATION OF BODY MATRIX COILS IN MR SYSTEMS

BACKGROUND OF THE INVENTION

1. Field of the Invention

The present invention concerns methods and devices for position determination of body matrix coils in MR systems.

2. Description of the Prior Art

Magnetic resonance apparatuses for examination of patients in particular via magnetic resonance tomography (MR) are known from DE10314215B4, for example.

Modern magnetic resonance system operate with coils to emit radio-frequency pulses for excitation of nuclear spins and/or to receive the induced magnetic resonance signals. A magnetic resonance system typically has a permanent magnet or (more often) a superconducting coil that generates a basic magnetic field (H0) that is optimally homogeneous, a whole body coil (also called a body coil or BC) that is large and is normally installed permanently in the MR apparatus, and multiple small local coils (also called surface coils or LCs). To obtain data from which images of a patient can be generated, selected regions of the subject or patient to be examined are read out with gradient coils for three axes (for example X, Y approximately radial to the patient, Z in the longitudinal direction of the patient). The spatial coding in magnetic resonance tomography is typically produced by a gradient coil system with three independently controllable, magnetically orthogonal gradient field coil systems. By overlaying the three, freely scalable fields (in three directions X, Y, Z), the orientation of the coding plane ('gradient field') can be freely selected.

In an MR examination, local MR coils (local coils) composed of a housing and one or more antenna coils (resonators) that can be substantially freely positioned on the surface of the patient to be examined (thus "anterior" if the patient is located in a dorsal position) are frequently used to transmit and/or receive. For an MR examination there are advantages to knowing the position of the MR coils in the z-direction (the z-direction corresponds to the longitudinal axis of the patient bed on which the patient lies). Workflows can be accelerated and be designed more comfortably with this knowledge since a scanner or computer controlling the examination workflow can take on large parts of the positioning and selection of the correct coils in the case of particular body regions to be scanned. Conventionally, an overview MR image has been produced at the beginning of an imaging examination of a patient, from which overview MR image the positions of the local coils can be automatically calculated if the characteristic antenna profiles of the MR antennas are known.

SUMMARY OF THE INVENTION

An object of the present invention is an efficient optimization of the determination of the location of local coils.

This object is achieved according to the invention by a position determination device to determine the position of a local coil for a magnetic resonance tomography apparatus, with at least one magnetic field strength sensor to measure a field strength of a magnetic field of the magnetic resonance tomography apparatus at least one location, and with an evaluation device to determine the position of the local coil based on field strengths measured at multiple locations.

The above object also is achieved according to the invention by a method to determine the position of a local coil for a magnetic resonance tomography apparatus with a position determination device, wherein the field strength of a magnetic field is measured at multiple locations with at least one magnetic field strength sensor, and the position of the local coil is determined based on the field strength measured at multiple locations.

The invention enables the position determination of the local coils to be implemented with the aid of sensors to measure the static magnetic field strength (for example 3D Hall sensors).

In an embodiment of the invention, the static H0 field (basic magnetic field) of the MR system outside of the homogeneity region of the magnet around the local coil is measured with the field strength sensors. The H0 field is highly stable and always present in modern MR systems. The relevant measurement region of the magnetic field is advantageously located above the patient bed, between the edge of the measurement tube and what is known as the 5-Gauss line of the field (corresponds approximately to the outer end of the bed when it is completely retracted). The spatial curve of the static magnetic field strength H0 is shown in highly simplified form in FIG. 2. In the actual stored models, field distortions due to the measurement chamber are incorporated. The modeling of the H0 field is based on three-dimensional near field measurements at discrete spatial points, wherein the field strength is interpolated in intervening spaces with the aid of known physical models and numerical simulations.

The z-component of the position is of primary interest.

The advantages of this solution are as follows.

No MR experiment to generate an overview MR image is required to begin the measurement.

A limitation to the field of view (region in which images are acquired) of the MR system is not present—the positioning functions in principle at every point of the bed (as long as this point is located outside of the homogeneity region of the magnet).

The position measurement functions if the door is open—it thus also best suited for what is known as "push button MR".

A possible covering of the coils with a blanket (used over the patient) has no effect.

The position measurement can in principle be implemented very quickly—only a few data of the magnetic field probes (MSH) are to be processed per antenna (antenna-by-antenna).

In principle a very precise position of the antennas can also be determined (it is dependent on the precision of the magnetic field distribution model).

For position determination, the spatial field curve around the local coil can be determined with only one or with multiple field strength sensors.

A measurement with one or more sensors can ensue at various locations whose relative positions (i.e. the position vectors relative to one another) are known. In order to achieve an established precision and unambiguity, it is appropriate to measure the field strength at multiple positions with a minimum interval (distance) therebetween (depending on the desired precision).

In the embodiments discussed in the following, one or more field strength sensors are placed on the local coil.

The measurement of the field strength then ensues at different locations (that are known relative to one another). According to one embodiment of the invention, these different locations are realized by placing multiple sensors on the local coil. According to a further embodiment of the invention, it is possible to move the coil and the sensors with the aid of the patient bed table. During such a travel of the bed, the field strength can be measured along one or more lines (depending on the number of sensors) that run parallel to the z-axis of the MR magnet. Due to the flat design of most local coils that are used today, a flat measurement section results at a minimum. Due to a (most often unwanted) tilting, the measurement section can also be cuboid; an improvement due to a better unambiguity can even result due to this. The absolute position of the measured field strength section within the total magnetic field is determined with the assistance of a stored field model and with a three-dimensional fitting algorithm (for example Marquardt-Leuvenberg). Expressed in another way, the position of the measured field strength section (thus the measured points, the measured line, the area or the cuboid) can be searched for in the model. The minimum distance between the measurement points (thus the necessary resolution) results from the desired positioning precision and the shape of the field curve in the measurement region that is relevant in practice, for example.

For a lower precision, as an alternative embodiment there is the possibility to implement the measurement with a great many sensors per coil without the bed being moved.

The field strength measurement points used for localization can be located at locations with a known distance vector relative to a reference point on the local coil (for example, according to one embodiment of the invention they are mounted on the coil). It is possible to determine the location of the local coils within the inhomogeneous magnetic field, and therefore the position in the MR system. The static H0 field is initially measured at multiple points in the H0 field with distance vectors known relative to one another. The positions of the magnetic field sensors in the H0 field are thereupon determined using a stored model (physical/numerical table model) using the measured field strengths. This calculation can ensue, for example, using a nonlinear optimization algorithm (for example the Levenberg-Marquardt algorithm). If the positions of the measured points are known, then the position of the coil itself can be calculated via the likewise known distance vector relative to the reference point.

In order to minimize the electronic expenditure on the local coil, the calculations can be implemented outside of the local coil and measurement signals can be directed from the local coil to a calculation unit A. (The position of the patient bed or its movement actuator are also know to the calculation unit A here, and it communicates with the MRT apparatus to collect and evaluate image data.) Given use of multiple sensors on the coil, the signals for this are appropriately to be transmitted to the calculation unit with a multiplexing method in order to save on conductors and contacts.

BRIEF DESCRIPTION OF THE DRAWINGS

FIG. 2 is a curve of the field strength H0 in a magnetic resonance tomography apparatus.

DESCRIPTION OF THE PREFERRED EMBODIMENTS

Figure 1:
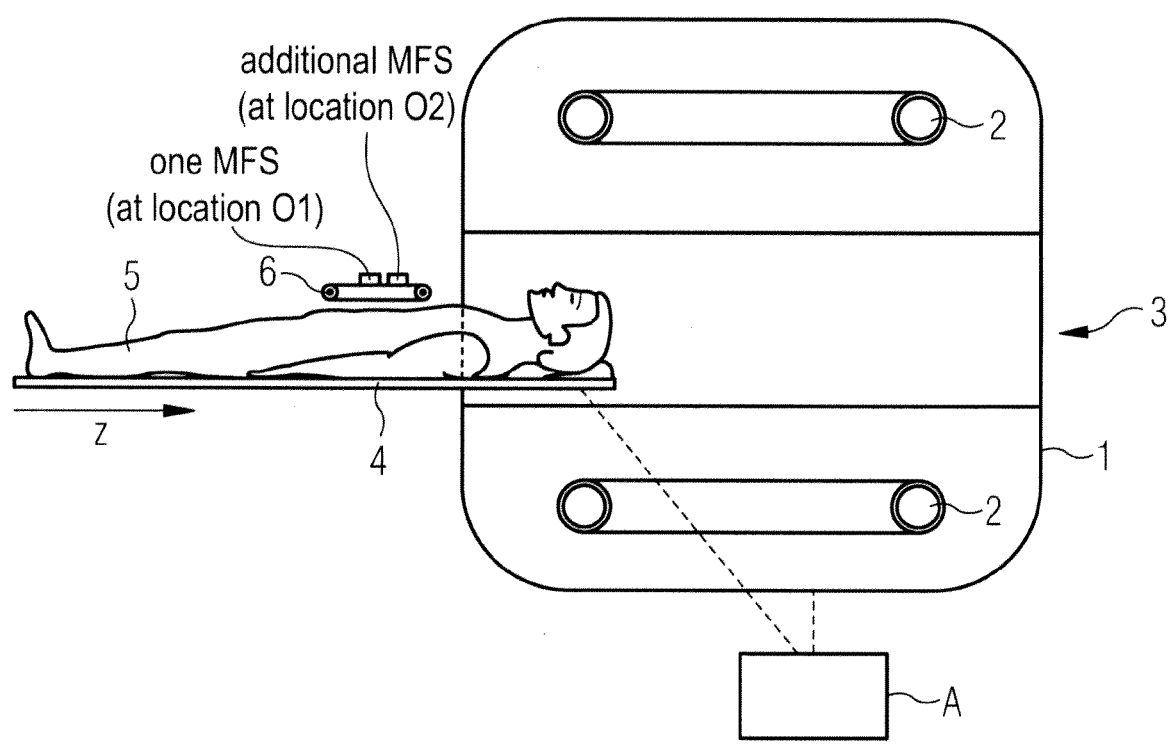
FIG. 1 schematically illustrates a magnetic resonance apparatus.

FIG. 1 shows a magnetic resonance apparatus 1 with a whole-body coil 2 and a tube-shaped space 3 in which a patient bed 4 with (for example) a patient 5 and a local coil 6 can be driven in direction z in order to generate MRT exposures of the patient 5.

FIG. 2 shows a curve of the field strength H0 of the basic magnetic field in a magnetic resonance tomography apparatus. The field strength H0 of the basic magnetic field can be approximately uniform within the tube 3 of the MRT 1, and the field lines there in the examination region also run approximately parallel to one another in the z-direction (due to shim magnets etc.). The basic magnetic field can be more non-uniform outside of this space of uniform field distribution than inside. In FIG. 2 exemplary lines B1, B2, B3 of identical magnetic field strength of the basic magnetic field are shown that, for example, can be determined via manual or automatic movement of a magnetic field probe MFS (also called a magnetic field strength sensor in the following), and the lines can be stored together with their location (as a model) in a memory in the magnetic resonance tomography apparatus 1.

The magnetic field probe MFS'can, for example, be installed in a local coil, or can be attached thereto in a detachable manner (for example plugged in), or can be positioned on the local coil. Multiple magnetic field probes MFS can also be provided at the local coil 6.

The coil position of the local coil 6 can be shifted in a region (designated as "coil position" in FIG. 2) from location O1 (at which only one magnetic field probe MFS is shown) across the location O2 (at which a magnetic field probe MFS and the patient and the local coil are shown) and even further into the tube 3 via movement of the patient bed 4 in the direction z. The determination of the position here in particular ensues based on measurements of the magnetic field at locations O1, O2 of the magnetic field sensor outside of the acquisition region in the tube since the magnetic field is more inhomogeneous outside, and therefore a good position determination is enabled. If the bed is then moved further, for example from the position O2 in FIG. 2 to the position O3 in the tube 3 of the MRT, the position of the local coil there can, be obtained for example, by vectorial addition of the additional travel path of the patient bed from the last determined position O2 if, for example, the travel path of the patient bed is known to an element A of the MRT.

As an alternative or in addition to a position determination relative to the MRT, the positions of multiple local coils relative to one another can also be determined and evaluated.

During this shift of the coil position, the basic magnetic field H0 can be measured at multiple locations O1, O2 with one or more magnetic field probes MFS. Values of the magnetic field H0 measured with multiple magnetic field probes MFS at least one point in time or with one magnetic field probe MFS at multiple point in time (during a displacement of the patient bed) can be compared with values of the magnetic field H0 that are stored in a memory of the magnetic resonance tomography apparatus 1 in order to determine the position of the local coil (in particular relative to the MRT or relative to the patient bed), for example before a planned acquisition of the patient with the MRT 1.

For example, if specific values of the magnetic field strength are respectively determined with each of multiple magnetic field probes MFS and the interval of these magnetic field probes MFS is known (for example because they are attached or positioned at a specific position on the local coil), it can be established which values of the magnetic field strength—that are stored in a memory together with their (detection) location (relative to the MRT)—for locations of the same separation exhibit identical values of the field strength, or the best matching set of stored values of field strengths and locations can be determined with an optimization algorithm.

The position of the local coil 6 relative to the MRT 1 is therefore known and can be taken into account in the evaluation of image data acquired in an MRT acquisition of the patient 5 with the MRT 1 to obtain an image.

In order to be able to determine the position of the local coil 6 more precisely, values of the field strength that are measured with one or more magnetic field sensors MRS [sic] at multiple points in time during a displacement of the patient bed 5 in the direction z (or analogously in the opposite direction) and the locations (in particular relative to other magnetic field sensors) at which a respective magnetic field sensor measures a value can also be taken into account in an optimization method. The position change of the magnetic field sensors MRS due to the movement of the bed in a vectorial direction can be taken into account when this vectorial direction is provided to an evaluation device A.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance tomography apparatus comprising:
    a basic field magnet that generates a basic magnetic field having a known field strength distribution;
    a local coil located within said basic magnetic field;
    at least one magnetic field strength sensor that measures the field strength of said magnetic field at least one location, said magnetic field strength sensor emitting a sensor signal representing the field strength of said magnetic field at said at least one location, said at least one magnetic field strength sensor having a known spatial relationship to said local coil; and
    an evaluation device supplied with said sensor signal configured to determine a position of said local coil in said basic magnetic field from said sensor signal, using said known field strength distribution and said known spatial relationship of said magnetic field strength sensor to said local coil.

2. An apparatus as claimed in claim 1 comprising a single magnetic field strength sensor that measures said field strength at multiple locations respectively at multiple points in time.

3. An apparatus as claimed in claim 1 comprising a plurality of magnetic field strength sensors that respectively measure said field strength at multiple locations, substantially simultaneously.

4. An apparatus as claimed in claim 1 comprising a plurality of magnetic field strength sensors that respectively measure said field strength of said magnetic field at multiple locations and at multiple points in time.

5. An apparatus as claimed in claim 1 wherein said basic magnetic field has a field axis proceeding substantially longitudinally in said data acquisition unit, and wherein said magnetic field strength sensor measures said field strength of said basic magnetic field in a direction of said magnetic field axis, and wherein said evaluation device determines said position of said local coil along said magnetic field axis.

6. An apparatus as claimed in claim 1 comprising a memory, accessible by said evaluation device, containing stored memory field strength values respectively for a plurality of locations in said data acquisition unit, said stored memory field strength values being stored in association with the location at which each field strength value was measured, and wherein said evaluation unit is configured to determine said position of said local coil by accessing and using said stored memory field strength values and said stored memory locations therefor.

7. An apparatus as claimed in claim 1 wherein said magnetic field strength sensor measures said magnetic field strength at respective locations having a relative spacing therebetween, and comprising a memory in which field strengths respectively measured at multiple locations are stored as stored memory field strength values, together with the respective location, as a memory location value, at which the stored memory field strength values were measured, and wherein said evaluation unit is configured to determine the position of the location coil by accessing and using said stored memory field strength values and said stored location values to identify respective stored location values of respective stored memory field strength values having a relative spacing therebetween corresponding to the relative spacing of the magnetic field strengths measured by said magnetic field strength sensor.

8. An apparatus as claimed in claim 1 wherein said magnetic resonance data acquisition unit comprises a patient bed that is movable relative to said basic magnetic field, said local coil being located on said patient bed and said magnetic field strength sensor measuring said magnetic field at said different locations at different times as said local coil located on said patient bed moves relative to said basic magnetic field, and comprising a memory, accessible by said evaluation unit, in which stored memory field strength values are stored together with respective locations, stored as stored location values, and wherein said evaluation unit is configured to determine the position of the local coil by accessing and using said stored magnetic field strength values and said stored location values by comparison with the field strength measured by said magnetic field sensor as said local coil moves on said patient table relative to said basic magnetic field.

9. An apparatus as claimed in claim 8 wherein said magnetic field sensor measures said magnetic field at a point in time at which image data, for generating an image of a patient located on the patient table, are acquired in said magnetic resonance acquisition unit.

10. An apparatus as claimed in claim 1 wherein said evaluation unit is configured to determine said position of said local coil using a non-linear optimization method.

11. An apparatus as claimed in claim 1 wherein said at least one magnetic field sensor is mechanically connected to said local coil.

12. An apparatus as claimed in claim 1 wherein a plurality of magnetic field strength sensors are mechanically connected to said local coil at fixed positions with a known spacing between magnetic field strength sensors in said plurality of magnetic field strength sensors relative to each other.

13. An apparatus as claimed in claim 1 wherein said evaluation unit is located remote from said local coil.

14. A method for operating a resonance tomography apparatus comprising a basic field magnet that generates a basic magnetic field having a known field strength distribution, and a local coil located within said basic magnetic field, said method comprising the steps of:
    with at least one magnetic field strength sensor, measuring the field strength of said magnetic field at least one location, and from said magnetic field strength sensor, emitting a sensor signal representing the field strength of said magnetic field at said at least one location;
    positioning said at least one magnetic field strength sensor at a known spatial relationship to said local coil; and
    in a computerized evaluation device supplied with said sensor signal, automatically determining a position of said local coil in said basic magnetic field from said sensor signal, using said known field strength distribution and said known spatial relationship of said magnetic field strength sensor to said local coil.

15. A method as claimed in claim 14 comprising measures said field strength at multiple locations respectively at multiple points in time with a single magnetic field strength sensor.

16. A method as claimed in claim 14 comprising, with a plurality of magnetic field strength sensors, respectively measuring said field strength at multiple locations, substantially simultaneously.

17. A method as claimed in claim 14 comprising, with a plurality of magnetic field strength sensors, respectively measuring said field strength of said magnetic field at multiple locations and at multiple points in time.

18. A method as claimed in claim 14 wherein said basic magnetic field has a field axis proceeding substantially longitudinally in said data acquisition unit, and measures said field strength of said basic magnetic field with said magnetic field strength sensor in a direction of said magnetic field axis and, in said evaluation device, determining said position of said local coil along said magnetic field axis.

19. A method as claimed in claim 14 comprising storing stored memory field strength values in a memory accessible by said evaluation device, respectively for a plurality of locations in said data acquisition unit, and storing said stored memory field strength values with an association with the location at which each field strength value was measured and, in said evaluation unit, determining said position of said local coil by accessing and using said stored memory field strength values and said stored memory locations therefor.

20. A method as claimed in claim 14 comprising measuring said magnetic field strength with said magnetic field strength sensor at respective locations having a relative spacing therebetween, and storing field strengths respectively measured at multiple locations as stored memory field strength values in a memory, together with the respective location, as a memory location value, at which the stored memory field strength values were measured, and in said evaluation unit, determining the position of the location coil by accessing and using said stored memory field strength values and said stored location values to identify respective stored location values of respective stored memory field strength values having a relative spacing therebetween corresponding to the relative spacing of the magnetic field strengths measured by said magnetic field strength sensor.

21. A method as claimed in claim 14 wherein said magnetic resonance data acquisition unit comprises a patient bed that is movable relative to said basic magnetic field, said local coil being located on said patient bed, and measuring said magnetic field with said magnetic field strength sensor at said different locations at different times as said local coil located on said patient bed moves relative to said basic magnetic field, and in a memory accessible by said evaluation unit, storing stored memory field strength values together with respective locations, stored as stored location values, and in said evaluation unit, determining the position of the local coil by accessing and using said stored magnetic field strength values and said stored location values by comparison with the field strength measured by said magnetic field sensor as said local coil moves on said patient table relative to said basic magnetic field.

22. A method as claimed in claim 21 comprising measuring said magnetic field with said magnetic field sensor at a point in time at which image data, for generating an image of a patient located on the patient table, are acquired in said magnetic resonance acquisition unit.

23. A method as claimed in claim 14 comprising, in said evaluation unit, determining said position of said local coil using a non-linear optimization method.

24. A method as claimed in claim 14 comprising mechanically connecting said at least one magnetic field sensor to said local coil.

25. A method as claimed in claim 14 comprising mechanically connecting a plurality of magnetic field strength sensors to said local coil at fixed positions with a known spacing between magnetic field strength sensors in said plurality of magnetic field strength sensors relative to each other.

26. A method as claimed in claim 14 comprising locating said evaluation unit remotely from said local coil.

* * * * *